United States Patent
Kim

(10) Patent No.: US 10,657,920 B2
(45) Date of Patent: May 19, 2020

(54) DISPLAY PANEL, DISPLAY DEVICE AND SIGNAL TRANSMISSION DEVICE

(71) Applicant: BOE Technology Group Co., Ltd., Beijing (CN)

(72) Inventor: Seo Yoon Kim, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 36 days.

(21) Appl. No.: 15/752,391

(22) PCT Filed: Jul. 24, 2017

(86) PCT No.: PCT/CN2017/094058
§ 371 (c)(1),
(2) Date: Feb. 13, 2018

(87) PCT Pub. No.: WO2018/040794
PCT Pub. Date: Mar. 8, 2018

(65) Prior Publication Data
US 2019/0005911 A1     Jan. 3, 2019

(30) Foreign Application Priority Data

Aug. 31, 2016   (CN) .......................... 2016 1 0798578

(51) Int. Cl.
*G09G 3/36*     (2006.01)
*G09G 5/10*     (2006.01)
(Continued)

(52) U.S. Cl.
CPC ....... *G09G 3/3677* (2013.01); *G02F 1/13452* (2013.01); *G02F 1/13454* (2013.01);
(Continued)

(58) Field of Classification Search
CPC .......... G09G 3/3677; G09G 3/36; G09G 3/10; G09G 2300/0408; G09G 2360/14;
(Continued)

(56) References Cited

U.S. PATENT DOCUMENTS 6,356,251 B1     3/2002   Naito et al.
2006/0193148 A1*  8/2006   Bang ................. G02F 1/133603
                                                    362/607
(Continued)

FOREIGN PATENT DOCUMENTS

CN     101515094 A     8/2009
CN     202487083 U    10/2012
(Continued)

OTHER PUBLICATIONS

Oct. 30, 2017—(WO) International Search Report and Written Opinion Appn PCT/CN2017/094058 with English Translation.
(Continued)

*Primary Examiner* — Wing H Chow
(74) *Attorney, Agent, or Firm* — Banner & Witcoff, Ltd.

(57) ABSTRACT

A display panel, a display device and a signal transmission device are provided. The display panel includes: an array substrate; an opposed substrate arranged opposite to the array substrate; a circuit board, disposed on a side of the array substrate away from the opposed substrate; a driving circuit, disposed on a side of the array substrate close to the opposed substrate; a light emitter, disposed on a side of the circuit board close to the array substrate and electrically connected with the circuit board, in which the light emitter includes a light emitting surface which faces the array substrate; and a light receiver, disposed on a side of the array substrate close to the opposed substrate and electrically (Continued)

connected with the driving circuit, in which the light receiver includes a light receiving surface which faces the light emitter.

14 Claims, 3 Drawing Sheets

(51) Int. Cl.
| | |
|---|---|
| *H01L 27/12* | (2006.01) |
| *H05K 1/02* | (2006.01) |
| *H04B 10/80* | (2013.01) |
| *G02F 1/1335* | (2006.01) |
| *G02F 1/1345* | (2006.01) |
| *G02F 1/133* | (2006.01) |
| *G02F 1/1339* | (2006.01) |

(52) U.S. Cl.
CPC ......... *G02F 1/133526* (2013.01); *G09G 3/36* (2013.01); *G09G 5/10* (2013.01); *H01L 27/12* (2013.01); *H01L 27/1214* (2013.01); *H04B 10/803* (2013.01); *H05K 1/02* (2013.01); *G02F 1/1339* (2013.01); *G02F 2001/13312* (2013.01); *G09G 2300/0408* (2013.01); *G09G 2360/14* (2013.01); *G09G 2370/18* (2013.01)

(58) Field of Classification Search
CPC .......... G09G 2370/18; G02F 1/133526; G02F 1/13452; G02F 1/13454; G02F 1/1339; H01L 27/12; H01L 27/1214
See application file for complete search history.

(56) References Cited

U.S. PATENT DOCUMENTS

| | | | |
|---|---|---|---|
| 2012/0242920 A1* | 9/2012 | Xu | .................... G02F 1/136213 |
| | | | 349/42 |
| 2013/0181962 A1* | 7/2013 | Bulovic | ............... G09G 3/3216 |
| | | | 345/207 |
| 2015/0280835 A1 | 10/2015 | Kajiyama et al. | |

FOREIGN PATENT DOCUMENTS

| | | |
|---|---|---|
| CN | 103810981 A | 5/2014 |
| EP | 0513993 A2 | 11/1992 |
| WO | 0247053 A1 | 6/2002 |

OTHER PUBLICATIONS

Mar. 11, 2020—(EP) Extended European Search Report Appn 17838114. 1.

\* cited by examiner

DISPLAY PANEL, DISPLAY DEVICE AND SIGNAL TRANSMISSION DEVICE

The application is a U.S. National Phase Entry of International Application No. PCT/CN2017/094058 filed on Jul. 24, 2017, designating the United States of America and claiming priority to Chinese Patent Application No. 201610798578.5 filed on Aug. 31, 2016. The present application claims priority to and the benefit of the above-identified applications and the above-identified applications are incorporated by reference herein in their entirety.

TECHNICAL FIELD

Embodiments of the present disclosure relate to a display panel, a display device and a signal transmission device.

BACKGROUND

With the rapid development of display technology, display technology has been widely applied in electronic products such as TVs, mobile phones and navigators and become an important part in people's lives.

FIG. 1 is a schematic structural view of a display panel. As illustrated in FIG. 1, the display panel 200 comprises an array substrate 210, an opposed substrate 220, a circuit board 230 and a Flexible Printed Circuit (FPC) 240. A driving chip and/or a controlling chip (not shown) are disposed on the circuit board 230. The array substrate 210 and the opposed substrate 220 are arranged opposite to each other. The array substrate 210 is electrically connected with the circuit board 230 through the FPC 240, so that an electrical signal can be transmitted from the circuit board 230 to the array substrate 210 and is utilized to drive the display panel to display image information. In FIG. 1, the FPC 240 is bonded to the array substrate 210 and the circuit board 230 through an anisotropic conductive film (ACF). In order to bond the FPC 240 to the array substrate 210, a certain space, namely a bonding region, is required to be reserved in the array substrate 210. Thus, an area of the array substrate 210 is required to be greater than that of the opposed substrate 220, which will reduce a ratio of a displaying area to a panel area of the display panel 200 (namely screen-to-body ratio).

For instance, FIG. 2 is a flow diagram of a manufacturing method of the display panel as shown in FIG. 1, and is a flow diagram illustrating a process of bonding the circuit board 230 to the array substrate 210. As shown in FIG. 2, firstly, a dispensing device 260 is adopted to apply an ACF 250 to an edge of a side of the array substrate 210 provided with a contact pad; secondly, a first end 241 of the FPC 240 is bonded to the array substrate 210 applied with the ACF 250, and a contact terminal of the FPC 240 is electrically connected with a corresponding contact pad on the array substrate 210; then, the dispensing device 260 is adopted to apply an ACF 250 to an edge of a side of the circuit board 230; and finally, a second end 242 of the FPC 240 is bonded to the circuit board 230 applied with the ACF 250, and the contact terminal of the FPC 240 is electrically connected with a corresponding contact pad on the circuit board 230. In addition, in order to avoid damp corrosion and dust and foreign matter scratches, a resin coating process may be also performed. Thus, the process required for connecting the circuit board 230 to the array substrate 210 through the FPC 240 is complex, and factors such as temperature, pressure and static electricity will result in defects during bonding the ACF 250 and bonding of the FPC 240 to the circuit board 230 and the array substrate 210. Moreover, a process of product maintenance is also relatively complex.

SUMMARY

At least one embodiment of the present disclosure provides a display panel, the display panel comprises: an array substrate; an opposed substrate arranged opposite to the array substrate; a circuit board, disposed on a side of the array substrate away from the opposed substrate; a driving circuit, disposed on a side of the array substrate close to the opposed substrate; a light emitter, disposed on a side of the circuit board close to the array substrate and electrically connected with the circuit board, in which the light emitter includes a light emitting surface which faces the array substrate; and a light receiver, disposed on a side of the array substrate close to the opposed substrate and electrically connected with the driving circuit, in which the light receiver includes a light receiving surface which faces the light emitter.

At least one embodiment of the present disclosure further provides a display device comprising the display panel as mentioned above.

At least one embodiment of the present disclosure further provides a signal transmission device, the signal transmission device is applied to a display panel and comprises: a light emitter, including a light emitting surface and configured to receive electrical signal and emit light from the light emitting surface according to the received electrical signal; and a light receiver, including a light receiving surface which faces the light emitter and configured to convert light intensity information received by the light receiving surface into electrical signal and output the electrical signal.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

DETAILED DESCRIPTION

Figure 1:
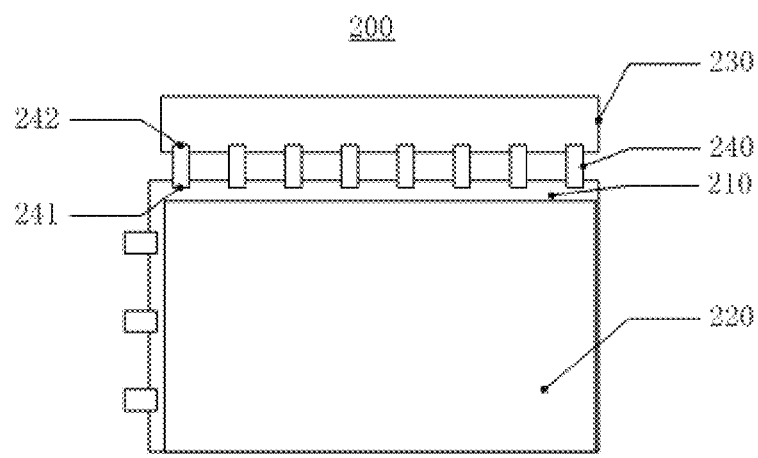
FIG. 1 is a schematic structural view of a display panel.
Figure 2:
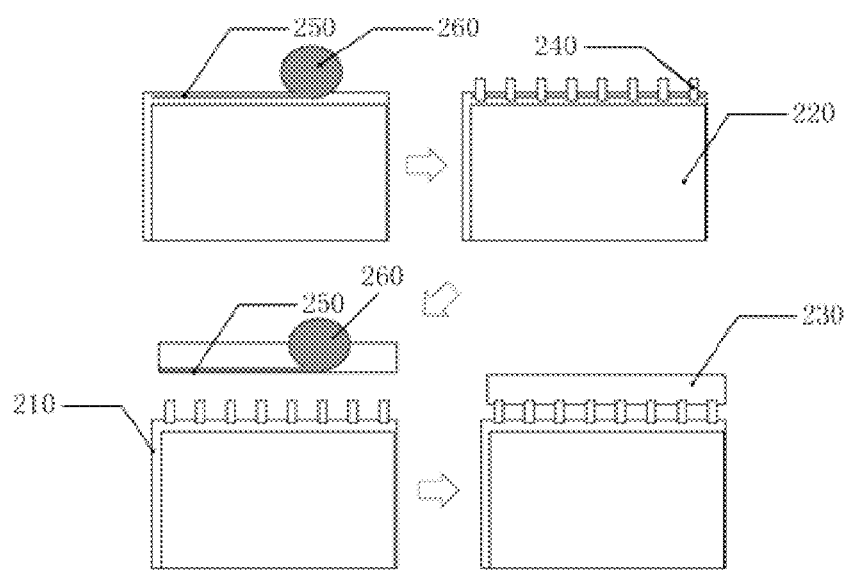
FIG. 2 is a flow diagram of a manufacturing method of the display panel as shown in FIG. 1.

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present application for disclosure, are not intended to indicate any sequence, amount or importance, but distinguish various components. Also, the terms such as "a," "an," etc., are not intended to limit the amount, but indicate the existence of at least one. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

Currently, a circuit board provided with a driving circuit (e.g., a driving chip) may be connected to a liquid crystal panel through an (Flexible Printed Circuit) FPC, and the FPC may be bonded to an array substrate of a display panel through an ACF, so scanning signals, data signals, clock signals or the like outputted by the driving circuit may be transmitted to the display panel and drive the display panel to achieve displaying. A region where the circuit board and the display panel are bonded to each other includes a plurality of terminals, the structure thereof is relatively complex, the manufacturing process is also cumbersome; it is relatively easy for defects to occur; and the repairing process in the case of the failure of the liquid crystal panel is also complex.

At least one embodiment of the present disclosure provides a display panel, which comprises: an array substrate, an opposed substrate, a circuit board, a driving circuit, a light receiver and a light emitter. The opposed substrate and the array substrate are arranged opposite to each other; the circuit board is disposed on a side of the array substrate away from the opposed substrate; the driving circuit is disposed on a side of the array substrate close to the opposed substrate; the light emitter is disposed on a side of the circuit board close to the array substrate and electrically connected with the circuit board; the light emitter includes a light emitting surface which faces the array substrate; the light receiver is disposed on a side of the array substrate close to the opposed substrate and electrically connected with the driving circuit; and the light receiver includes a light receiving surface which faces the light emitter.

The display panel transmits signals by arrangement of the light emitter and the light receiver, so the transmission of the signals from the circuit board to the driving circuit can be realized without process of bonding the FPC. Therefore, the process difficulty in manufacturing the display panel can be reduced, and the product yield of the display panel can be improved.

Figure 3:
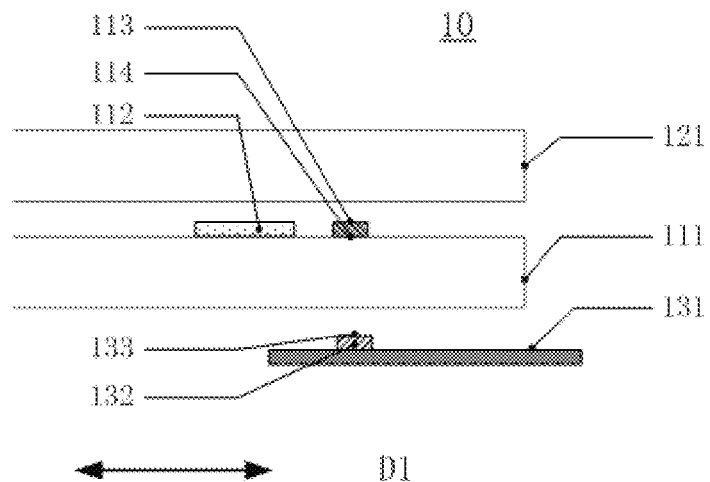
FIG. 3 is a schematic structural view of a display panel provided by an embodiment of the present disclosure.

For instance, FIG. 3 is a schematic structural view of a display panel provided by an embodiment of the present disclosure. As illustrated in FIG. 3, the display panel 10 comprises an array substrate 111, an opposed substrate 121, a circuit board 131, a driving circuit 112, a light receiver 113 and a light emitter 132. The opposed substrate 121 and the array substrate 111 are arranged opposite to each other; the circuit board 131 is disposed on a side of the array substrate 111 away from the opposed substrate 121; the driving circuit 112 is disposed on a side of the array substrate 111 close to the opposed substrate 121; the light emitter 132 is disposed on a side of the circuit board 131 close to the array substrate 111 and electrically connected with the circuit board 131; the light emitter 132 includes a light emitting surface 133 which faces the array substrate 111; the light receiver 113 is disposed on a side of the array substrate 111 close to the opposed substrate 121 and electrically connected with the driving circuit 112; and the light receiver 113 includes a light receiving surface 114 which faces the light emitter 132.

The light emitter 132 and the light receiver 113 are arranged opposite to each other with the array substrate 111 disposed therebetween. Thus, optical signal emitted by the light emitter 132 can be received by the light receiver 113 and converted into electrical signal. The light emitter 132 and the light receiver 113 are cooperated with each other. Adopted light may be visible light or invisible light (e.g., infrared light or ultraviolet light).

For instance, the array substrate may be a transparent substrate such as a glass substrate or a quartz substrate. Thus, the light can transmitted through the array substrate.

The driving circuit 112 is, for instance, a gate-driver on array (GOA) and hence may be directly formed on the array substrate. The circuit board 131 is provided with a driving chip and the like and may be configured to receive and decode video signal.

The working principle of the display panel 10 is as follows: firstly, the circuit board 131 applies signal to be transmitted to outputted light by modulation (e.g., intensity modulation) of light outputted from the light emitter 132; then, light emitted from the light emitter 132 transmits through the array substrate 111 and is incident onto the light receiving surface 114 of the light receiver 113, and the light receiver 113 receives the optical signal and converts the optical signal into electrical signal; and then, the electrical signal is transmitted to the driving circuit 112, and the driving circuit 112 drives the display panel to display image information according to the received electrical signal.

Therefore, the display panel 10 transmits signal by arrangement of the light emitter 132 and the light receiver 113, can realize transmission of the signal from the circuit board 131 to the driving circuit 112 without bonding the circuit board 131, and hence can reduce the process difficulty in manufacturing the display panel 10 and improve the product yield of the display panel 10. In addition, as a space for bonding the circuit board 131 is not required to be reserved in the array substrate 111, and the circuit board 131 may be disposed on a side of the array substrate 111 away from the opposed substrate 121, the screen-to-body ratio of the display device comprising the display panel 10 can be improved.

For instance, in an embodiment of the present disclosure, the array substrate 111 of the display panel 10, for instance, may be obtained by polysilicon manufacturing process, and an active element (e.g., a switching element and the like) of a pixel unit on the array substrate 111 may adopt, for instance, a low-temperature polysilicon thin-film transistor (TFT), a high-temperature polysilicon TFT, etc. The light receiver 113 may also be implemented through a TFT. For instance, the light receiver 113 may be selected from a group consisting of a polysilicon TFT, an oxide semiconductor TFT and a photodiode. Thus, the polysilicon TFT, the oxide semiconductor TFT or the photodiode may be also formed and taken as the light receiver 113 in a process of manufacturing the array substrate 111. Therefore, the light receiver 113 may be directly formed on the array substrate 111, so the complexity of the manufacturing process of the display panel 10 can be reduced, and the fixing problem of the light receiver 113 can be avoided.

For instance, when the light receiver 113 includes the photodiode, optical adhesive (e.g., UV-cured resin) may be utilized to fix the light receiver 113 on the array substrate 111 or between the array substrate 111 and the opposed substrate 121.

For instance, in the embodiment of the present disclosure, the driving circuit 112 may also be directly formed on the array substrate 111 by using polysilicon manufacturing process (e.g., low-temperature polysilicon manufacturing process). Thus, the complexity of the manufacturing process of the display panel 10 can be reduced, and the fixing problem of the driving circuit 112 can be avoided. However, the forming mode of the driving circuit 112 is not limited to the polysilicon manufacturing process. The driving circuit 112 may also be bonded to the array substrate 111 through an ACE For instance, in the embodiment of the present disclosure, if the active elements (e.g., the switching element or a driving element) and the like of the pixel unit in the array substrate adopt an oxide semiconductor TFT (namely, a thin film transistor in which oxide semiconductor is used as an active layer) and the light receiver also adopts a corresponding oxide semiconductor TFT, the pixel unit of the array substrate and the light receiver may also be formed by same manufacturing process. The oxide semiconductor may be indium gallium zinc oxide (IGZO), zinc oxide (ZnO), etc.

For instance, in the embodiment of the present disclosure, the light emitter 132 may be directly disposed on the circuit board 131 and may also be fixed on the circuit board 131 or the display panel 10 through a mounting base. The light emitter 132 is selected from a group consisting of an LED and a laser diode. As the LED and the laser diode have small volume, a display region of the array substrate 111 can be increased. Thus, the screen-to-body ratio of the display device 20 can be improved, and the encapsulation volume of the display device can be reduced. Obviously, the light emitter 132 is not limited to be the LED or the laser diode and may also be an element capable of converting electrical signal into optical signals, e.g., a solid laser or a gas laser.

For instance, in the embodiment of the present disclosure, as the light emitter 132 is electrically connected with the circuit board 131 (not shown in FIG. 3), the circuit board 131 may drive the light emitter 132 to emit light and may apply signal to light emitted by the light emitter 132. For instance, the circuit board 131 may drive the light emitter 132 to output light within a period of time and not output light within a period of time through voltage applied to the light emitter 132. The state of outputting light and the state of not outputting light may respectively represent 1 and 0 in binary digital signal. Obviously, the light emitted by the light emitter 132 may also adopt other modulation formats (e.g., duobinary modulation format) or modulation types (e.g., phase modulation) to apply signal. No limitation will be given here in the embodiment of the present disclosure.

For instance, in the embodiment of the present disclosure, the circuit board 131 is selected from a group consisting of an FPC and a PCB (e.g., a hard PCB). The use of the FPC can reduce the encapsulation volume of the display device.

Figure 4:
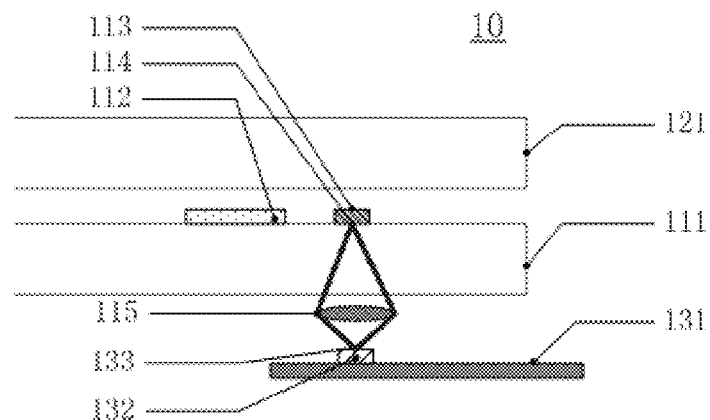
FIG. 4 is a schematic structural view of another display panel provided by an embodiment of the present disclosure.

For instance, FIG. 4 is a schematic structural view of another display panel provided by an embodiment of the present disclosure. As illustrated in FIG. 4, the display panel 10 comprises an array substrate 111, an opposed substrate 121, a circuit board 131, a driving circuit 112, a light receiver 113 and a light emitter 132. The opposed substrate 121 and the array substrate 111 are arranged opposite to each other; the circuit board 131 is disposed on a side of the array substrate 111 away from the opposed substrate 121; the driving circuit 112 is disposed on a side of the array substrate 111 close to the opposed substrate 121; the light emitter 132 is disposed on a side of the circuit board 131 close to the array substrate 111 and electrically connected with the circuit board 131; the light emitter 132 includes a light emitting surface 133 which is arranged close to the array substrate 111; the light receiver 113 is disposed on a side of the array substrate 111 close to the opposed substrate 121 and electrically connected with the driving circuit 112; and the light receiver 113 includes a light receiving surface 114 which faces the light emitter 132.

For instance, in the embodiment of the present disclosure, the display panel 10 may further comprise an optical collector 115 which is disposed in an optical path of the light emitter 132. As shown in FIG. 4, the optical collector 115 includes a first focus (namely an image focus of the optical collector 115), and the first focus is disposed on the light receiving surface 114. The optical collector 115 is selected from a group consisting of a microlens, an aspherical lens and a spherical lens. A value of a focal length of the optical collector 115 may be selected according to actual application demand, and the specific position and manner of the optical collector 115 may be set according to the focal length and a distance between the light receiving surface 114 and the array substrate 111. For instance, the optical collector 115 may be disposed between the array substrate 111 and the opposed substrate 121 through optical adhesive. Moreover, for instance, the optical collector 115 may also be disposed between the array substrate 111 and the circuit board 131 through optical adhesive.

For instance, by arrangement of the optical collector 115, more light from the light emitter 132 can be gathered on the light receiving surface 114. Thus, the signal-to-noise ratio (SNR) of received signal can be improved, and the light emitter 132 can work under relatively lower driving power. In addition, as light spot is greatly diminished after focusing, an area of the light receiving surface 114 can be reduced, and hence the production cost of the light receiver and an area of the display region of the array substrate 111 can be reduced. Therefore, the arrangement of the optical collector 115 can reduce the production cost and the usage cost of the display device 20 comprising the display panel 10. It should be noted that it is difficult for the first focus to be completely coincide with the light receiving surface 114 due to assembly error. Even the first focus and the light receiving surface 114 are not completely coincided, the above effect can be also partially achieved. Therefore, all the cases in which more light is incident into the light receiving surface 114 by arrangement of the optical collector 115 shall fall within the protection scope of the present disclosure.

Figure 5:
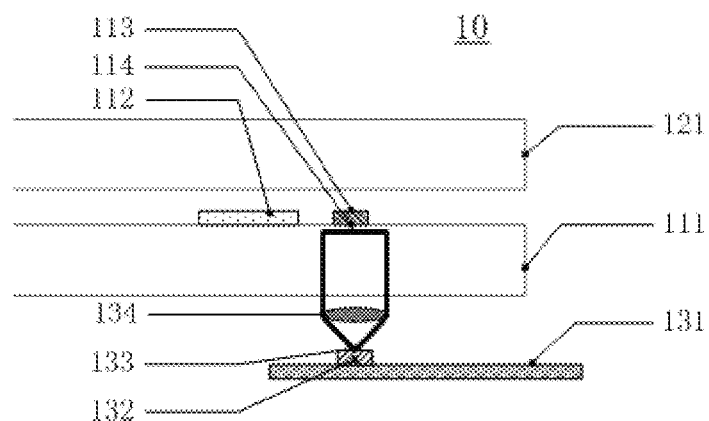
FIG. 5 is a schematic structural view of still another display panel provided by an embodiment of the present disclosure.

For instance, FIG. 5 is a schematic structural view of still another display panel provided by an embodiment of the present disclosure. As illustrated in FIG. 5, the display panel 10 may further comprise a collimator 134 in the optical path of the light emitter 132. The collimator 134 includes a second focus (namely an object focus of the collimator 134), and the second focus is disposed on the light emitting surface 133 (for instance, the collimator 134 may be fixed on the light emitter 132 through optical adhesive). The collimator 134 is selected from a group consisting of a microlens, an aspherical lens and a spherical lens. As the second focus of the collimator 134 is disposed on the light emitting surface 133, a divergence angle of light emitted from the light emitter 132 can be reduced, so more light from the light emitter 132 can be incident onto the light receiving surface 114 of the light receiver 113. Thus, the SNR of signal received by the light receiver 113 can be improved, and the light emitter 132 can be driven to work under relatively lower driving power. In addition, the increase of the received signal can also reduce the area of the light receiving surface and hence reduce the production cost of the light receiver and the area of the display region of the array substrate 111. Therefore, the arrangement of the collimator 134 can reduce the production cost and the usage cost of the display device 20 comprising the display panel 10. It should be noted that it is difficult for the second focus to completely coincide with the light receiving surface 133 due to assembly error. In addition, when the second focus is not completely coincident with the light emitting surface 133, the above effect can be also partially achieved. Thus, the divergence angle of the light from the light emitter 132 is reduced by arrangement of the collimator 134 and all the cases in which more light is incident onto the light receiving surface 114 shall fall within the protection scope of of the present disclosure.

Figure 6:
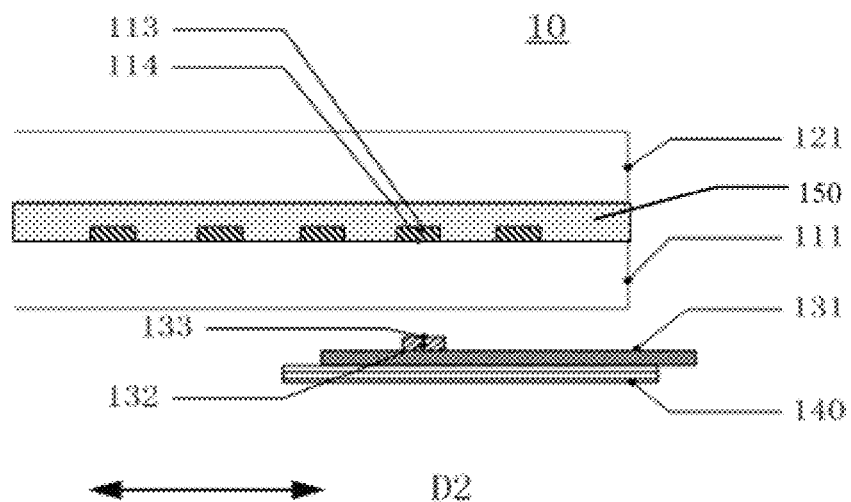
FIG. 6 is a schematic structural view of still another display panel provided by an embodiment of the present disclosure.

For instance, FIG. 6 is a schematic structural view of still another display panel provided by an embodiment of the present disclosure. As illustrated in FIG. 6, the display panel 10 comprises an array substrate 111, an opposed substrate 121, a circuit board 131, a driving circuit 112, a light receiver 113, a light emitter 132 and a moving unit 140. The opposed substrate 121 and the array substrate 111 are arranged opposite to each other; the circuit board 131 is disposed on a side of the array substrate 111 away from the opposed substrate 121; the driving circuit 112 is disposed on a side of the array substrate 111 close to the opposed substrate 121; the light emitter 132 is disposed on a side of the circuit board 131 close to the array substrate 111 and electrically connected with the circuit board 131; the light emitter 132 includes a light emitting surface 133 which is arranged close to the array substrate 111; the light receiver 113 is disposed on a side of the array substrate 111 close to the opposed substrate 121 and electrically connected with the driving circuit 112; the light receiver 113 includes a light receiving surface 114 which faces the light emitter 132; and the moving unit 140 is configured to drive the light emitter 132 to do translation motion.

For instance, as shown in FIG. 6, the display panel 10 comprises a plurality of light receivers 113 in a D2 direction (perpendicular to a D1 direction as shown in FIG. 3) and a one-dimensional electric moving stage taken as the moving unit 140. The moving unit 140 may do translation motion in the D2 direction. As the circuit board 131 is disposed on the moving unit 140 and the light emitter 132 is disposed on the circuit board 131, the moving unit 140 and the light emitter 132 may move in the D2 direction together, so the plurality of light receivers 113 can receive light emitted by one light emitter 132. Thus, the signal transmission speed can be improved by high-speed modulation of the light emitter 132.

Obviously, the moving unit 140 is not limited to the one-dimensional electric moving stage as shown in FIG. 6 and may also be set to be an element capable of driving the light emitter 132 to do translational motion, e.g., a two-dimensional electric moving stage, according to actual demands. In addition, the moving unit 140 may also be configured to drive the light emitter 132 to do translational motion. The moving unit 140, for instance, may be implemented by a guide rail or the like and, for instance, is driven by a stepper motor.

For instance, in the embodiment of the present disclosure, as shown in FIG. 6, the display panel 10 further comprises sealant 150. The sealant 150 is disposed at periphery of the array substrate 111. At least a part of the light receivers 113 may be disposed outside the sealant 150 or disposed inside the sealant 150 or disposed in the sealant 150. Thus, the area of the display region of the array substrate 111 can be increased, and hence the screen-to-body ratio of the display device comprising the display panel 10 can be improved. In addition, the sealant 150 may be also configured to fix the light receivers 113, so the process complexity can be reduced. Obviously, the light receivers 113 may be directly formed on the array substrate and may also be independently manufactured and subsequently disposed on the array substrate 111, for instance, may be disposed on the array substrate 111 by welding, clamping, bonding, etc.

Figure 7:
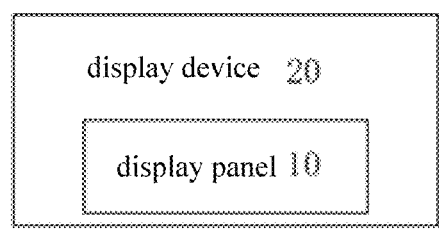
FIG. 7 is a schematic structural view of a display device provided by an embodiment of the present disclosure.

An embodiment of the present disclosure further provides a display device. FIG. 7 is a schematic structural view of the display device provided by the embodiment of the present disclosure. As illustrated in FIG. 7, the display device 20 comprises any foregoing display panel 10. For instance, the display device 20 may be: any product or component having displaying function such as a mobile phone, a tablet PC, a TV, a display, a notebook computer, a digital picture frame and a navigator.

The display device 20 can realize the transmission of signal from the circuit board to the driving circuit without the bonding of the circuit board by arrangement of the light receiver and the light emitter, and hence the process difficulty in manufacturing the display panel 10 can be reduced and the product yield of the display panel 10 can be improved. In addition, as a space for bonding the circuit board is not required to be reserved in the array substrate, and the circuit board may be disposed on a side of the array substrate away from the opposed substrate, the screen-to-body ratio of the display device comprising the display panel 10 can be improved.

It should be noted that other necessary components of the display device shall all be understood by those skilled in the art to be included and shall not be construed as the limitation of the present disclosure. No further description will be given here.

The embodiment of the present disclosure further provides a signal transmission device, which is applied to the display panel. The signal transmission device comprises a light emitter and a light receiver. The light emitter includes a light emitting surface and is configured to receive electrical signal and emit light from the light emitting surface according to the received electrical signal. The light receiver includes a light receiving surface which faces the light emitter, and is configured to convert light intensity information received by the light receiving surface into electrical signal and output the electrical signal.

For instance, as shown in FIG. 4, the signal transmission device further comprises an optical collector 115. The optical collector 115 includes a first focus (namely an image focus of the optical collector 115), and the first focus is disposed on the light receiving surface 114. The optical collector 115 is selected from a group consisting of a microlens, an aspherical lens and a spherical lens. A value of a focal length of the optical collector 115 may be selected according to actual application demand, and the specific position and manner of the optical collector 115 may be set according to the focal length and a distance between the light receiving surface 114 and the array substrate 111. For instance, the optical collector 115 may be disposed between the array substrate 111 and the opposed substrate 121 through optical adhesive. Moreover, for instance, the optical collector 115 may also be disposed between the array substrate 111 and the circuit board 131 through optical adhesive.

For instance, by arrangement of the optical collector 115, more light from the light emitter 132 can be gathered on the light receiving surface 114. Thus, the SNR of received signal can be improved, and the light emitter 132 can work under lower driving power. In addition, as light spot after focusing is greatly decreased, an area of the light receiving surface 114 can be reduced, and hence the production cost of the light receiver and the area of the display region of the array substrate 111 can be reduced. Therefore, the arrangement of the optical collector 115 can reduce the production cost and the usage cost of the display device 20 comprising the display panel 10. It should be noted that the first focus can be difficult to completely coincide with the light receiving surface 114 due to assembly error. Even the first focus and the light receiving surface 114 are not completely coincident, the above effect can be also partially achieved. Therefore, all the cases in which more light is incident into the light receiving surface 114 by arrangement of the optical collector 115 shall fall within the protection scope of the present disclosure.

For instance, in the signal transmission device, the optical collector 115 is selected from a group consisting of a microlens, an aspherical lens and a spherical lens.

For instance, in the signal transmission device, the light emitter is selected from a group consisting of an LED and a laser diode.

For instance, as illustrated in FIG. 5, the signal transmission device further comprises a collimator 136. The collimator 136 includes a second focus (namely an object focus of the collimator 134), and the second focus is disposed on the light emitting surface 133 (for instance, the collimator 134 may be fixed on the light emitter 132 through optical adhesive). The collimator 134 is selected from a group consisting of a microlens, an aspherical lens and a spherical lens. As the second focus of the collimator 134 is disposed on the light emitting surface 133, a divergence angle of the light emitted by the light emitter 132 can be reduced, so more light from the light emitter 132 can be incident into the light receiving surface 114 of the light receiver 113. Thus, the SNR of the signal received by the light receiver 113 can be improved, and the light emitter 132 can be driven to work under lower driving power. In addition, the increase of the received signals can also reduce an area of the light receiving surface and hence the production cost of the light receiver and an area of the display region of the array substrate 111 can be reduced. Therefore, the arrangement of the collimator 134 can reduce the production cost and the usage cost of the display device 20 comprising the display panel 10. It should be noted that it is difficult for the second focus to be completely coincided with the light receiving surface 133 due to assembly error. In addition, when the second focus is not completely coincident with the light emitting surface 133, the above effect can be also partially achieved. Thus, the divergence angle of the light from the light emitter 132 is reduced by arrangement of the collimator 134. Therefore, all the cases in which more light is incident into the light receiving surface 114 shall fall within the protection scope of the present disclosure.

For instance, in the signal transmission device, the collimator is selected from a group consisting of a microlens, an aspherical lens and a spherical lens.

For instance, as shown in FIG. 6, the signal transmission device further comprises a moving unit 140. The moving unit 140 is configured to drive the light emitter to do translational motion. The display panel 10 comprises a plurality of light receivers 113 in a D2 direction (perpendicular to a D1 direction as shown in FIG. 3) and a one-dimensional electric moving stage taken as the moving unit 140. The moving unit 140 may do translational motion in the D2 direction. As the circuit board 131 is disposed on the moving unit 140 and the light emitter 132 is disposed on the circuit board 131, the moving unit 140 may drive the light emitter 132 to move in the D2 direction, so the plurality of light receivers 113 can receive light emitted by one light emitter 132. Thus, the signal transmission speed can be improved by high-speed modulation of the light emitter 132.

Obviously, the moving unit 140 is not limited to the one-dimensional electric moving stage as shown in FIG. 6 and may also be set to be an element capable of driving the light emitter 132 to do translational motion, e.g., a two-dimensional electric moving stage, according to actual demands. In addition, the moving unit 140 may also be configured to drive the light emitter 132 to do translational motion. The moving unit 140, for instance, may be implemented by a guide rail or the like and, for instance, is driven by a stepper motor.

The display panel, the display device and the signal transmission device, provided by an embodiment of the present disclosure, have at least one of the following advantages:

(1) In the display panel provided by at least one embodiment of the present disclosure, as the light receiver and the light emitter are disposed on the display panel, the transmission of signal from the circuit board to the driving circuit can be realized without bonding process of the circuit board, so the process difficulty in manufacturing the display panel can be reduced, and the product yield of the display panel can be improved.

(2) In the display panel provided by at least one embodiment of the present disclosure, as a space for bonding the circuit board is not required to be reserved in the array substrate, and the circuit board may be disposed on a side of the array substrate away from the opposed substrate, the screen-to-body ratio of the display device comprising the display panel can be improved.

(3) In the display panel provided by at least one embodiment of the present disclosure, if at least a part of light receivers are disposed in the sealant or inside the sealant, an area of the display region of the array substrate can be increased, so the screen-to-body ratio of the display device comprising the display panel can be improved. In addition, the sealant can also fix the light receiver, so the process complexity can be reduced.

(4) In the display panel provided by at least one embodiment of the present disclosure, if the semiconductor manufacturing process for manufacturing the array substrate is adopted to manufacture a TFT as an active element of the pixel unit and the light receiver, the complexity of the manufacturing process of the display panel can be reduced, and the fixing problem of the light receiver can be avoided.

(5) In the display panel provided by at least one embodiment of the present disclosure, if the semiconductor manufacturing process is adopted to manufacture the driving circuit, the complexity of the manufacturing process of the display panel can be reduced, and the fixing problem of the driving circuit can be avoided.

(6) In the display panel provided by at least one embodiment of the present disclosure, if an LED or a laser diode is taken as the light emitter, a volume of both is small, so an area of the display region of the array substrate can be increased, and hence the screen-to-body ratio of the display device can be improved and the encapsulation volume of the display device can be reduced.

(7) In the display panel provided by at least one embodiment of the present disclosure, by arrangement of the optical collector and/or the collimator, more light from the light emitter can be gathered on the light receiving surface. Thus, the SNR of the received signal can be improved, and the light emitter can be driven to work under lower driving power. In addition, the increase of the received signals can also reduce the area of the light receiving surface and hence the production cost of the light receiver and the area of the display region of the array substrate can be reduced. Therefore, the arrangement of the optical collector and/or the collimator can reduce the production cost and the usage cost of the display device comprising the display panel.

(8) In the display panel provided by at least one embodiment of the present disclosure, by arrangement of the moving unit, the plurality of light receivers can receive light emitted by one light emitter, so the signal transmission speed can be improved by high-speed modulation of the light emitter.

The following statements should be noted:

(1) The accompanying drawings involve only the structure(s) in connection with the embodiment(s) of the present disclosure, and other structure(s) can be referred to common design(s).

(2) For the purpose of clarity only, in accompanying drawings for illustrating the embodiment(s) of the present disclosure, the thickness and size of a layer or a structure may be enlarged, that is, the accompanying drawings are not drawn according to the actual scale. However, it should understood that, in the case in which a component or element such as a layer, film, region, substrate or the like is referred to be "on" or "under" another component or element, it may be directly on or under the another component or element or a component or element is interposed therebetween.

(3) In case of no conflict, features in one embodiment or in different embodiments can be combined.

What are described above is related to the specific embodiments of the disclosure only and not limitative to the scope of the disclosure. The protection scope of the disclosure shall be based on the protection scope of the claims.

The present application claims priority to the Chinese Patent Application No. 201610798578.5 filed on Aug. 31, 2016, the entire disclosure of which is incorporated herein by reference as part of the present application.

The invention claimed is:

1. A display panel, comprising:
an array substrate;
an opposed substrate arranged opposite to the array substrate;
a circuit board, disposed on a side of the array substrate away from the opposed substrate;
a driving circuit, disposed on a side of the array substrate close to the opposed substrate;
a light emitter, disposed on a side of the circuit board close to the array substrate and electrically connected with the circuit board, in which the light emitter includes a light emitting surface which faces the array substrate; and
a light receiver, disposed on a side of the array substrate close to the opposed substrate and directly and electrically connected with the driving circuit, in which the light receiver includes a light receiving surface which faces the light emitter,
wherein the light receiver is configured to convert light intensity information received by the light receiving surface into an electrical signal and output the electrical signal to the driving circuit,
the light receiver provides the electrical signal to the driving circuit, the electrical signal is a signal which drives the display panel to display image information,
wherein the display panel further comprises a collimator, and the collimator includes a second focus which is disposed on the light emitting surface, and the collimator is selected from a group consisting of a microlens, an aspherical lens and a spherical lens, the collimator is disposed at a light-exiting side of the light emitter, the collimator is disposed between the light emitter and the light receiver, and a distance of the collimator and the light emitter is an object focal length, and
wherein the display panel further comprises a moving unit which is configured to drive the light emitter to do translational motion during displaying an image.

2. The display panel according to claim 1, further comprising an optical collector, wherein the optical collector includes a first focus which is disposed on the light receiving surface.

3. The display panel according to claim 2, wherein the optical collector is selected from a group consisting of a microlens, an aspherical lens and a spherical lens.

4. The display panel according to claim 1, wherein the light emitter is selected from a group consisting of a light-emitting diode and a laser diode.

5. The display panel according to claim 1, wherein the circuit board is selected from a group consisting of a flexible printed circuit board and a printed circuit board.

6. The display panel according to claim 1, wherein the light receiver is selected from a group consisting of a polysilicon thin-film transistor, an oxide semiconductor thin-film transistor and a photodiode.

7. The display panel according to claim 1, wherein the driving circuit is a driver on the array substrate which is directly formed on the array substrate.

8. The display panel according to claim 7, wherein the driving circuit is bonded to the array substrate by using an anisotropic conductive film.

9. The display panel according to claim 1, further comprising sealant, wherein the sealant is disposed at a periphery of the array substrate; and at least a part of the light receivers are disposed inside or outside the sealant or in the sealant.

10. A display device, comprising the display panel according to claim 1.

11. A signal transmission device, applied to a display panel, comprising:
a light emitter, including a light emitting surface and configured to receive an electrical signal and emit light from the light emitting surface according to the received electrical signal; and
a light receiver, including a light receiving surface which faces the light emitter and configured to convert light intensity information received by the light receiving surface into electrical signal and output the electrical signal,
wherein the light receiver is directly and electrically connected to a driving circuit of the display panel and provides the electrical signal to the driving circuit, and the electrical signal is a signal which drives the display panel to display image information,
wherein the signal transmission device further comprises a collimator, and the collimator includes a second focus which is disposed on the light emitting surface, and the collimator is selected from a group consisting of a microlens, an aspherical lens and a spherical lens, the collimator is disposed at a light-exiting side of the light emitter, the collimator is disposed between the light emitter and the light receiver, and a distance of the collimator and the light emitter is an object focal length, and wherein signal transmission device further comprises a moving unit which is configured to drive the light emitter to do translational motion during displaying an image.

12. The signal transmission device according to claim 11, further comprising an optical collector, wherein the optical collector includes a first focus which is disposed on the light receiving surface.

13. The signal transmission device according to claim 12, wherein the optical collector is selected from a group consisting of a microlens, an aspherical lens and a spherical lens.

14. The signal transmission device according to claim 11, wherein the light emitter is selected from a group consisting of an LED and a laser diode.

\* \* \* \* \*